July 9, 1957 E. F. W. ALEXANDERSON 2,798,904
PUSH-PULL MAGNETIC AMPLIFIER
Filed Sept. 1, 1953
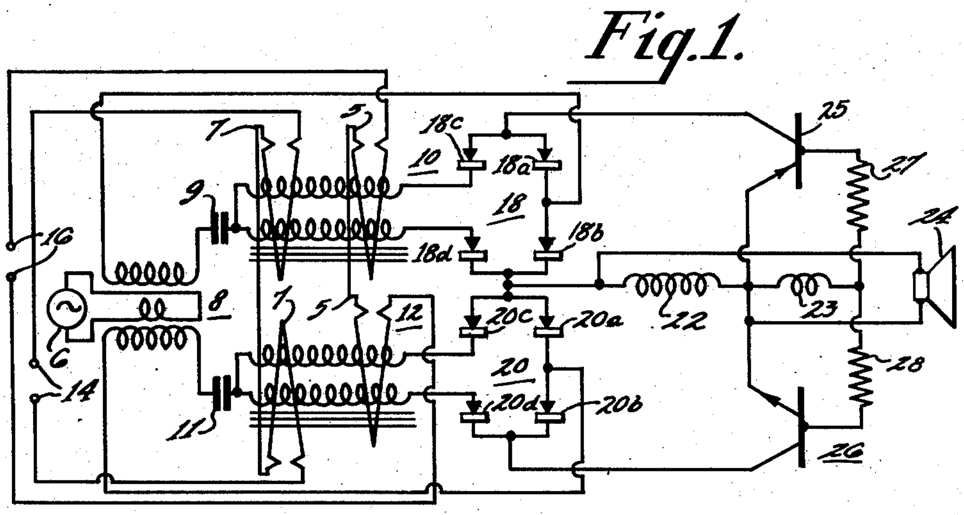
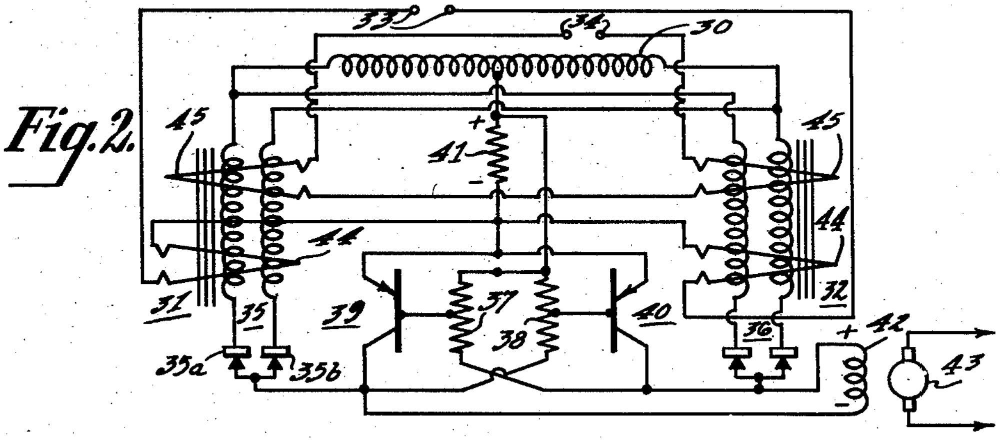
Fig. 2.
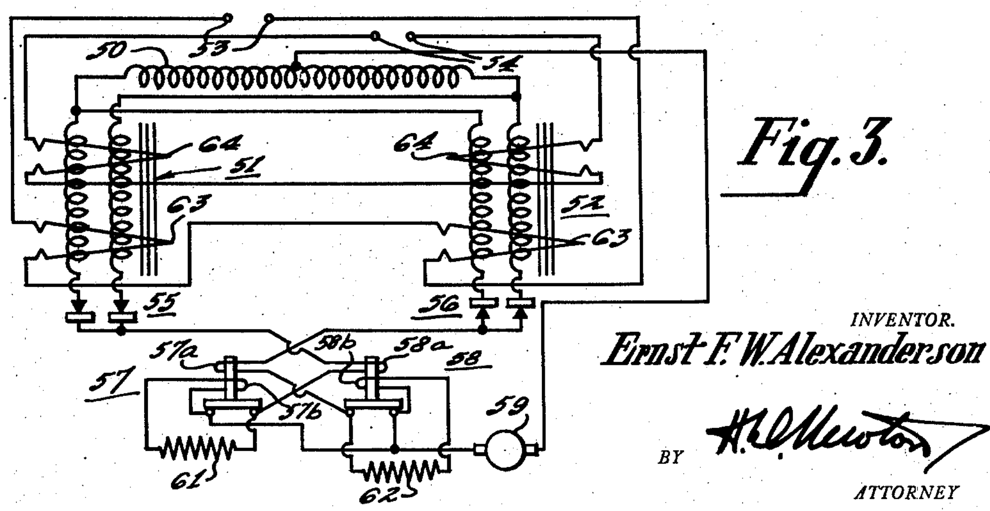
Fig. 3.
INVENTOR.
Ernst F. W. Alexanderson
BY H. L. Newton
ATTORNEY 2,798,904
Patented July 9, 1957

2,798,904

PUSH-PULL MAGNETIC AMPLIFIER

Ernst F. W. Alexanderson, Schenectady, N. Y.

Application September 1, 1953, Serial No. 377,853

7 Claims. (Cl. 179—171)

This invention relates to a magnetic amplifier system and more particularly to magnetic amplifiers connected in push-pull relationship for operation.

A magnetic amplifier is a variable-inductance device for controlling the flow of power to a load. The term magnetic amplifier has often been interchangeably used with the terms saturable reactor, transductor and the like, with the older term, saturable reactor, being the more widely recognized. However, it is now generally recognized that a saturable reactor is a part of a magnetic amplifier either alone or connected in combination with other circuit elements in such a manner as to obtain amplification or control.

Simple saturable reactors, saturable core reactors, D. C. controllable reactors, saturable transformers, transductors, and the like are saturable cored inductors having the alternating current winding impedance controlled through control of the saturation of the core. The impedance to the flow of alternating current is effected by changing the degree of saturation with a relatively small amount of direct current, or properly phased alternating current through a separate winding on the same core. An unsaturated core has a relatively high impedance to alternating currents. A saturated core acts effectively as an air core, with practically no impedance except for the ohmic resistance of the reactor windings.

Technically, a magnetic amplifier may be described as essentially a device which controls the alternating current reactance of a coil by controlling the effective permeability of the magnetic material upon which the core is wound. A simplified magnetic amplifier may consist of a control circuit, and a load circuit. The control circuit includes control windings magnetically coupled with the saturable reactor for providing saturation control of the reactor core. The control windings are generally wound and related to the reactor windings that alternating currents of the power frequency induced therein oppose each other and balance out.

The load circuit of a simplified magnetic amplifier includes the series connection of a source of alternating current power, a saturable reactor and a load impedance. The signal current applied to the control windings determines the point during the alternating current power cycle that the core saturates, and allows load current to flow. In this respect a magnetic amplifier may be considered analogous to a thyratron control circuit.

In order to connect magnetic amplifiers in push-pull circuits where the load current of each amplifier flows through a common load impedance, means must be provided to prevent the circuitry of one amplifier from providing a short-circuit current path and diverting the signal output current of the other amplifier. Heretofore, the corrective measures attempted have resulted in unnecessary power loss and make the magnetic amplifier very inefficient.

It is accordingly a principal object of this invention to provide an improved push-pull magnetic amplifier for efficiently amplifying signal currents.

Another object of this invention is to provide an efficient push-pull magnetic amplifier having simplified circuitry and a high speed of response.

A further object of this invention is to provide improved means for connecting a pair of magnetic amplifiers to give amplified reversible rectified output signals.

A still further object of this invention is to provide a fast-acting push-pull magnetic amplifier for efficiently amplifying audio frequency signals.

In accordance with the present invention, a pair of magnetic amplifiers are connected for delivering signal modulated current in push-pull relation to a load circuit. A controllable device for preventing each amplifier from diverting the load currents of the other is provided in the series circuit of each amplifier. The controllable device may be a transistor or a contactor switch or a carbon pile controlled by a magnet. A vacuum tube might be used but would be undesirable for applications when the equipment is to be subjected to severe shock or where rugged equipment requiring only the most limited servicing is desired.

The devices are so controlled that the one serially connected with the activated amplifier provides substantially a short-circuiting connection, while the device associated with the idle amplifier provides a high impedance which appears to be substantially an open circuit. In this manner the idle amplifier appears as an open circuit to the activated amplifier and the signal current flows through the load impedance without attenuation or diversion thereof by the idle amplifier.

A further object of this invention is to provide an improved push-pull magnetic amplifier system comprising a pair of magnetic amplifiers connected with a common load element, and having means for selectively energizing one of said amplifiers to conduct load current and further means for preventing the diversion of said load currents.

Another object of this invention is to provide an improved push-pull magnetic amplifier system comprising a pair of magnetic amplifiers connected with a common load impedance element and having control means for selectively activating one of said amplifiers to conduct load current, and having further means to provide substantially an open circuit in the unactivated amplifier in response to the load current.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1 is a schematic circuit diagram of a pair of audio frequency magnetic amplifiers connected in push-pull relation and embodying the invention;

Figure 2 is a schematic circuit diagram of a pair of magnetic amplifiers connected in push-pull relation and embodying circuitry using a transistor controlling device in accordance with the invention for controlling the field winding of a motor or generator; and Figure 3 is a schematic circuit diagram of a pair of magnetic amplifiers connected in push-pull relation and embodying control circuitry using a pair of contactor switches in accordance with the invention for controlling a D. C. motor.

Referring now to Figure 1 wherein there is shown a schematic circuit diagram of a pair of magnetic amplifiers connected for amplifying audio signals, a source of high frequency power 6 is connected with the primary of a transformer 8. The secondary windings of the transformer 8 deliver the high frequency power to the windings of the saturable reactors 10 and 12. The frequency of power source is a matter of design. It has been found desirable in some instances to construct the power source to have a frequency of from 2 to 5 times the highest signal frequency to be amplified to avoid beat notes and other disturbances.

The control circuit of the amplifier includes two pair of windings 5 and 7. An initial flux or magnetization of the magnetic circuit of the saturable reactors is provided by a pair of bias windings 5 which are connected with a pair of terminals 16. A source of direct current, not shown, may be connected with terminals 16 to provide a predetermined saturation of the reactor cores. The signal circuit includes a pair of signal windings 7 which are connected to a pair of terminals 14. The signal windings 7 and the bias windings 5 are wound in relatively opposite relationship or direction on the core of the saturable reactor 12 and are wound in the same direction on the core of the saturable reactor 10. A signal of relatively positive current will cause saturation in one of the reactor cores and hence, activate one of the magnetic amplifiers to conduct current and a relatively negative signal current activates the other amplifier to conduct current in a similar manner.

In effect the bias windings 5 produce a constant initial magnetization of the reactor core upon which is superimposed the magnetization due to the alternating current flowing in the signal windings 7. Since the magnetization produced by the direct current windings 5 is constant the resulting controlling magnetization of the magnetic circuit will vary at the frequency of the signal current supplied through the terminals 14 and, therefore, the current flowing in the alternating current circuit will be modulated at the frequency of the signal currents.

Each amplifier is independently tuned by the capacitors 9 and 11 respectively so that maximum current is drawn when the signal current is of full strength. It is recognized that a simple saturable reactor has a high speed of response if its terminal voltage is maintained constant while the alternating current consumed by the reactor is changed by the saturation control or signal windings. It is believed that the reason for this phenomenon is that the direct current saturating flux due to the reactor windings remains substantially constant and, therefore, no counter EMF is induced in the control windings. If on the other hand, the saturable reactor is used in such a way that its A. C. terminal voltage is changed by the action of the control current, the control flux will also be changed and since the control circuit has a high reactance with a large time constant the result will be a slow response.

If it were not for the capacitors 9 and 11, across which is developed a voltage which is in an opposite sense to the voltage across the terminals of the saturable reactor, the voltage across the reactor terminals would decrease. Such a decrease in voltage as mentioned above would be reflected into the control circuit and result in a sluggish amplifier; it can be seen that the effective voltage across the series combination of the saturable reactor and the capacitor can be quite low, while the actual voltages across the reactor windings and capacitor taken individually may be higher.

A pair of full wave rectifiers 18 and 20 are serially connected with the respective saturable reactors 10 and 12 to derive uni-directional load current. The saturable reactor 10 is comprised of a pair of parallel connected windings. Each of the windings is connected with a respective rectifier so that current flows through alternate windings in accordance with the polarity of the power source. Similar connections are provided for the reactor 12. An inductance winding 22 is serially connected in the magnetic amplifier circuit as the load impedance element. The uni-directional current from the rectifier 18 is connected to flow through the inductance winding 22 in an opposite direction to the unidirectional current from the reactor 20. An output circuit comprising a loudspeaker 24 is effectively connected in parallel to the load impedance or inductance winding 22. The signal voltage developed across the inductance load element 22 causes the loudspeaker 24 to be energized to convert the electrical energy to sound energy.

A pair of semi-conductor amplifiers such as the transistors 25 and 26 are serially connected in the output circuits of the two amplifiers. As will hereinafter be explained, the output of the conducting or activated amplifier would be short-circuited without the transistors or some other controlling device to provide a high impedance or to open the circuit of the unactivated amplifier. The transistors are so controlled that the transistor of the activated amplifier is substantially a short-circuit while the transistor of the idle amplifier is an open circuit. The transistor 25 is of the P-N-P type or may be a point contact N type transistor while the transistor 26 is an N-P-N or may be a P type point contact transistor.

The emitter electrodes of the transistors 25 and 26 are connected to a common terminal of the load impedance of the inductor 22. A transformer secondary winding 23 is coupled with the inductance winding 22 to produce a potential in response to load current flow through the inductance winding 22. The transformer winding 23 is connected at one end thereof to the junction of the emitter electrodes and the inductor 22. The other end of the transformer winding 23 is connected to the base electrode of the transistor 25 through a resistor 27 and to the base electrode of the transistor 26 through a resistor 28.

The operation of the push-pull magnetic amplifier circuit described above will now be described. At a predetermined instantaneous polarity, the high frequency generator 6 will deliver conventional current through the series circuit of one amplifier including the secondary of the power transformer 8, compensating capacitor 9, the lower portion of the saturable reactor 10, the rectifier 18*d*, the load impedance 22, the transistor 25, and back through the rectifier 18*a* to the secondary of transformer 8. On the next half cycle the current flows through the upper half of the reactor winding 10 and through rectifiers 18*c* and 18*b*, but the current flows in the same direction through the inductance winding 22.

Load current flows through the other magnetic amplifier in a similar manner except that the rectifiers 20*a, b, c. d,* are connected so that direct current through the load impedance or inductance windings 22 is opposite to that of the first amplifier.

The conduction of either amplifier is controlled by the instantaneous polarity of the signal voltage impressed on the signal windings 7 and the bias winding 5. As noted above, the signal windings 7 are oppositely wound on the cores of the reactor winding 12 and are wound in the same direction on the core of the reactor winding 10, hence, only one amplifier conducts at a time. It can be seen that while the amplifier including the saturable reactor 10 is conducting, the rectifiers 20*a* and 20*b*, without transistor 26, would provide substantially a short-circuit across the terminals of the load impedance 22. Also it is obvious that when the magnetic amplifier including the saturable reactor 12 is conducting, the rectifiers 18*a* and 18*b*, without transistor 25, would provide substantially a short-circuit across the load impedance 22. Such short-circuits would divert current from the load impedance and result in great loss of power and efficiency.

In accordance with the invention, a pair of transistors of opposite conductivity characteristics are connected in series with the load circuits of the magnetic amplifiers. The transformer winding 23, which is coupled with the load winding 22, is connected between the base and emitter electrodes of the transistors 25 and 26.

The polarity of the potential produced across the terminals of the transformer winding 23 depends on the direction of load current through the load element 22. This in turn, is dependent on which of the magnetic amplifier is energized to conduct load current. Since this potential is applied between the base emitter electrodes of the transistors 25 and 26 a bias control to cut off one transistor and gate the other has been provided. In the embodiment shown in Figure 1, when the amplifier including the saturable reactor 10 is activated to conduct current, the base electrodes are made negative with respect to the emitter electrodes by the action of the transformer winding 23. Such a potential provides a forward bias for the P-N-P type transistor 25 and a reverse bias for the N-P-N type transistor 26. In other words, the transistor 25 provides a low impedance whereas the transistor 26 will provide a high impedance. Since the transistor 26 presents a high impedance which may be considered as substantially an open circuit, the short-circuiting connection caused by rectifiers 20*a* and 20*b* across the load impedance 22 is effectively eliminated.

If the magnetic amplifiers were directly connected across the load impedance without the rectifiers 18 and 20, the inactivated amplifier would still divert signal current from the load impedance since the reactors, power transformer secondary windings, and compensating capacitors have a relatively low impedance to signal frequency currents as opposed to power frequency currents.

Referring now to Figure 2 where a push-pull magnetic amplifier system is connected for controlling the field winding of a motor or generator, a source of alternating current power which is represented as a center tapped winding 30 is connected with a pair of magnetic amplifiers including the saturable reactors 31 and 32. The saturable reactor 31 has two windings one connected across each half the center tapped winding, 30. A pair of rectifiers 35*a*, 35*b* are serially connected with each of the reactor windings so that current alternately flows through one winding and then the other in accordance with the polarity of the voltage across the winding 30, when the reactor 31 is energized. Similar connections are provided for the saturable reactor 32.

A pair of bias windings 44 are wound and magnetically coupled with the saturable reactors 31 and 32 for providing an initial magnetizing flux for the magnetic circuit. The bias windings are connected to a source of direct current (not shown) through a pair of terminals 33. A pair of signal windings 45 are connected respectively with a pair of terminals 34, and are wound in a relatively opposite relationship to the bias windings 44 on the core of the saturable reactor 31 and are wound in the same sense on the core of the saturable reactor 32 so that a signal current of one polarity activates one magnetic amplifier to conduct load current whereas a signal current of the opposite polarity activates the other magnetic amplifier. Appropriate control and biasing power sources for the signal windings 45 and the biasing windings 44 may be connected with each pair of terminals 33 and 34, as described in connection with Figure 1.

The load circuit of one of the magnetic amplifiers includes respectively the power source winding 30 and saturable reactor 31, rectifier 35, field winding 42 of a motor or generator 43, a semi-conductor 40, and a resistor 41 to the center tap of the winding 30. The second magnetic amplifier includes the power source, the saturable reactor 32, a rectifier 36, the motor or generator or field winding 42, a semi-conductor 39, and a resistor 41.

The two semi-conductors 39 and 40 are shown by way of example as symmetrical junction type P-N-P transistors. When the signal current is of such polarity that the magnetic amplifier including the saturable reactor windings 31 is conducting, the transistor control circuit including the resistors 37 and 38 causes the transistor 40 to be biased in a forward direction and the transistor 39 to be biased in a reverse direction.

The emitter electrodes of the transistors 39 and 40 are both connected through the resistor 41 to the center tap of the power winding 30. The collector electrodes are connected to opposite terminals of the field winding 42. The resistor 38 is connected from the same side of the field winding 42 as the collector electrode of the transistor 39 to the junction of the resistor 41 to the power source, and has a tap thereon which is connected to the base electrode of the transistor 40. The resistor 37 is connected from the other terminal of the field winding 42 to the junction of the resistor 41 and the power source 30 and also has a tap which is connected with the base electrode of the transistor 39.

When the saturable reactor 31 is activated to conduct current, the conventional current flow is from the center tap of the power source 30 through resistor 41, transistor 40, field winding 42, rectifier 35, the saturable reactors 31 and back to another terminal of the power source 30. The potential developed across the resistor 41 will cause currents to flow through the resistors 37 and 38 to produce appropriate biasing potential. The potential across the resistor 37 is substantially the same as that across the resistor 41 since the transistor 40 may be considered a short-circuit. This potential is presented between the emitter and base electrodes of the P-N-P transistor 39 so that the base is biased positive with respect to the emitter, or in a reverse direction. The extent of the bias depends on the position of the tap on the resistor 37 and are adjusted to maintain the transistor 39 cut off while the saturable reactor 31 is conducting load current.

The potential between the emitter and base electrodes of the transistor 40 is comprised of the potentials developed across the field winding 42, the resistor 41, and the transistor 40. If the transistor 40 is assumed to be a short-circuiting connection, it can be seen that potential across the field winding 42 and the resistor 41 are in opposite direction. By properly adjusting the tap on the resistor 38 the emitter can be made to have a negative potential relative to the base. Such a bias is in a forward direction to cause the P-N-P type transistor 40 to conduct and appear as substantially a short-circuit.

The operation of the magnetic amplifier system when the saturable reactor 32 is conducting is the same as that described above. It can be seen that there has been provided a pair of magnetic amplifiers which have been combined in push-pull relation across a given load circuit in such a manner that the output current of one amplifier is not diverted by low impedance circuit connections of the other amplifier.

Referring now to Figure 3 which shows a pair of magnetic amplifiers for controlling a D. C. motor, an alternating current power source winding 50 is connected with the magnetic amplifiers which include the saturable reactors 51 and 52. A pair of control bias windings 63 are connected with a pair of terminals 55 and coupled respectively with the saturable reactors 51 and 52 for providing an initial magnetizing flux for the magnetic circuit. A pair of signal windings 64 connected respectively with a pair of terminals 54 are wound in a relatively opposite relationship or direction as the bias windings on the core of the saturable reactor 52 and are wound in the same sense or direction as the core of the saturable reactor 51. A signal current for a given polarity activates one amplifier whereas the signal current of the opposite polarity upsets the magnetic balance to activate the other amplifier.

Appropriate control and signal power sources for the bias and signal control windings are connected with each pair of terminals 53 and 54.

The saturable reactors 51 and 52 each have two windings which conduct alternately the load current during alternate half cycles of the power source alternations. The saturable reactors 51 and 52 are serially connected respectively through a pair of oppositely connected rectifiers 55 and 56 to a pair of electromagnetically controlled and normally closed contactor switches 57 and 58. The contactor switches are connected through a D. C. motor 59 to the center tap of the power source winding 50.

When the saturable reactor 51 is activated, current flows through the winding 58a of the contactor switch in such a direction to hold the conductive plunger of the contactor switch 58 away from the contact terminals. The winding 58a is connected to one contact terminal of the contactor switch 57 the conductive plunger of which is normally closed, to provide a short-circuiting path between the two contact terminals thereof. A conductive connection from a second contact terminal of contactor switch 57 is made to the D. C. motor 59 so that the load current flows from the control winding 58a through the motor back to the power source.

The motor can, therefore, speed up and develop a counter EMF which would normally be short-circuited by the magnetic amplifier using the saturable reactor 52 if it were not for open contact plunger of the switch 58. After the motor has attained some speed its current may be reduced to zero by the action of the signal fed to the control windings.

In order to keep the contactor switch 58 from closing under these circumstances there is another control of the contactor magnets responsive to the voltage across the corresponding contact terminals. This voltage control is shown as combined with the shunt resistors 61 and 62 which are connected across the terminals and for some purposes are needed for braking the motor with its load. It can thus be seen that as long as the motor continues to run in the original direction, the winding 58b which is wound oppositely relative to the winding 58a is energized by the back EMF to cause the contact 58 to stay open even though the amplifier using the saturable reactor 51 is deactivated by the signal.

The energy consumed in the resistance 62 then produces a braking torque. This braking torque is increased as the signal is reversed and activates the saturable reactor 52. When the motor has then been brought to a standstill by the braking action, the contactor switch 58 closes because there is no control action to keep it open.

It can be seen that the contactors do not introduce any discontinuity in the control of the motor by the signal. The contactors function when the motor is at a standstill and serve to prevent an idle amplifier from interfering with the regulating functions of the activated one.

It can be seen that in accordance with the present invention, an improved push-pull magnetic amplifier has been provided which is effectively connected so that the output signals of one amplifier are not diverted or attenuated by the other amplifier. The invention provides a fast-acting amplifier for efficiently controlling relatively large amounts of power.

What is claimed is:

1. A magnetic amplifier system comprising, alternating current supply means, a load impedance element for said system, a pair of saturable reactors each having a winding, circuit means connecting said windings and said current supply means in pushpull relation with said load impedance element so that current in one direction through said load impedance element is due to the current through one of said windings and current in the opposite direction through said load impedance element is due to the current through the other of said windings, control means for said saturable reactors operable to establish one of said windings more conductive and the other of said windings less conductive, first switching means serially connected with one of said windings, second switching means serially connected with the other of said windings, and control circuit means responsive to the direction of current flow in said load impedance element connected with said load impedance element and both of said switching means for operating said switching means in the path of the more conductive winding to provide a relatively low series impedance and the switching means in the path of the other winding to provide a relatively higher series impedance.

2. A magnetic amplifier system as defined in claim 1 wherein said switching means comprises an electromagnetically controlled contactor switch.

3. A magnetic amplifier system for audio frequency signals comprising, high frequency alternating current supply means, a first and second saturable reactors each having a control winding and a load winding magnetically coupled thereto, a first and second rectifier means, a load impedance element for said system, a first series circuit including said first saturable reactor load winding, said first rectifier, said load impedance element and said power supply means whereby current from said first saturable reactor load winding is conveyed in only one direction through said load impedance element, a second series circuit including said second saturable reactor load winding in series with said second rectifier, said load impedance element and said power supply means whereby current from said second saturable reactor load winding is conveyed only in a second direction through said load impedance element, a signal input circuit for said magnetic amplifier system, means connecting said control windings with said input circuit to bias said reactors in opposite directions in response to current flowing in said control windings whereby one of said saturable reactor load windings is conditioned to conduct current and the second saturable reactor load winding is cut off, a pair of semi-conductor devices of opposite conductivity characteristics, one of said semi-conductor devices being connected in said first series circuit and the other semi-conductor device being connected in said second series circuit, circuit means for providing a potential of predetermined polarity in response to the direction of current through said impedance element, means applying said potential to said semi-conductor devices whereby a forward bias is applied to one semi-conductor to provide a low impedance in the circuit of the reactor winding which is conditioned to conduct current, and a reverse bias is applied to the other semi-conductor to provide a high impedance in the circuit of the reactor winding which is cut off.

4. A push-pull magnetic amplifier system for audio frequency signals comprising, high frequency alternating current supply means; first and second saturable reactors each having a main winding and a control winding; first and second rectifier means; first and second switching means; a load impedance element for said system; a first series circuit including said load impedance element, said first saturable reactor main winding, said first rectifier, said first switching means and said power supply means whereby current through said first saturable reactor main winding is conveyed in only a first direction through said load impedance element; a second series circuit including said load impedance element, said second saturable reactor main winding, said second rectifier, said second switching means and said power supply means whereby current through said second saturable reactor main winding is conveyed in only a second direction through said load impedance element; signal input circuit means for said amplifier system; means connecting said control winding with said signal input circuit means in a manner to vary the impedance of said saturable reactor main windings in opposite directions in response to input signals from said signal input circuit whereby one of said saturable reactor main winding is rendered more conductive and the other of said saturable reactor main winding is rendered less conductive; and control circuit means responsive to the direction of current through a said load impedance element connected with said first and second switch means to condition said first and second switching means to provide, respectively, a low impedance in the circuit of the more conductive main winding and a high impedance in the circuit of the less conductive main winding.

5. A magnetic amplifier system comprising, a load impedance element for said system, a pair of saturable reactors each having a winding serially connected in push-pull relation with said load impedance element, rectifier means for deriving uni-directional load currents connecting said windings with said load impedance element so that current in one direction through said load impedance element is due to one of said windings and current in the opposite direction through said load impedance element is due to the other of said windings, first switching means serially connected with one of said windings, second switching means serially connected with the other of said windings, and control circuit means responsive to the direction of current flowing in said load impedance element connected with said load impedance element and each of said switching means for operating with switching means to provide a relatively low series impedance in the path of one of said windings and a relatively higher impedance in the other of said windings.

6. A magnetic amplifier system comprising, alternating current supply means, a load impedance element for said system, a pair of saturable reactors each having a winding, circuit means connecting said windings and said current supply means in push-pull relation with said load impedance element so that current in one direction through said load impedance element is due to the current through one of said windings and current in the opposite direction through said load impedance element is due to the current through the other of said windings, control means for said saturable reactors operable to establish one of said windings more conductive and the other of said windings less conductive, switching means comprising a pair of semi-conductor amplifiers serially connected with each of said windings, and control circuit means for said switching means responsive to the current flow in said load impedance element for operating said switching means to provide a relatively low series impedance in the path of the more conductive winding and a relatively higher series impedance in the path of the other winding comprising a circuit for producing a bias potential for application to said semi-conductor amplifiers whereby a forward bias is applied to the semi-conductor amplifier connected in series with the more conductive winding and a reverse bias is applied to the semi-conductor amplifier connected in series with the less conductive winding.

7. A magnetic amplifier system for audio frequency signals comprising, high frequency alternating current supply, a first and second magnetic amplifiers each including a saturable reactor winding and series connected rectifier, a load impedance element for said system, a first series circuit including said first magnetic amplifier saturable reactor winding, said load impedance element and said power supply, a second series circuit including said second magnetic amplifier saturable reactor winding, said load impedance element and said power supply, said load impedance being connected in said series circuits whereby current from said first magnetic amplifier saturable reactor winding is conveyed through said load impedance in one direction and current from said second magnetic amplifier saturable reactor winding is conveyed through said load impedance in a second direction, means providing a source of audio frequency input signals to be amplified, control means for said saturable reactors connected with said source for biasing said first amplifier saturable reactor winding in a direction to conduct current and biasing said second amplifier saturable reactor winding toward cut-off for input signals of one sense, and biasing said second amplifier saturable reactor winding in a direction to conduct current and biasing said first amplifier saturable reactor winding toward cut-off for input signals of the opposite sense, means responsive to the direction of said currents in said load impedance comprising a pair of voltage responsive devices respectively connected in series with each of said amplifier saturable reactor windings and said load impedance and having conditions of high and low impedance, control circuit means for said devices including a first resistor serially connected with each of said amplifiers and said devices, a second resistor connected across the series combination of said first resistor, and said load impedance, and one of said devices, a third resistor across the series combination of said first resistor load impedance and the other of said devices, connections from said second resistor to said one device and from said third resistor to said other device whereby potentials are applied to said devices provide a low series impedance for the device connected with the conducting amplifier saturable reactor winding and provide a relatively high series impedance for the device connected with the other amplifier saturable reactor winding in response to the direction of said currents through said load impedance.

References Cited in the file of this patent

UNITED STATES PATENTS

| | | |
|---|---|---|
| 2,341,526 | Breitenstein | Feb. 15, 1944 |
| 2,518,865 | Cartotto | Aug. 15, 1950 |
| 2,555,992 | Ogle | June 5, 1951 |
| 2,617,090 | Ogle | Nov. 4, 1952 |
| 2,710,313 | Logan | June 7, 1955 |

OTHER REFERENCES

AIEE publication—Miscellaneous Paper 50–93, December 1949, "Magnetic Amplifiers of the Balance Detection Type—Their Basic Principle Characteristics, and Application," by W. A. Geyger.